(12) United States Patent
Wang et al.

(10) Patent No.: US 10,637,007 B1
(45) Date of Patent: Apr. 28, 2020

(54) METHOD FOR MANUFACTURING FLEXIBLE DISPLAY DEVICE AND FLEXIBLE DISPLAY DEVICE

(71) Applicant: Wuhan China Star Optoelectronics Semiconductor Display Technology Co., Ltd., Wuhan, Hubei (CN)

(72) Inventors: Mingliang Wang, Hubei (CN); Szuyuan Wang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 182 days.

(21) Appl. No.: 16/069,279

(22) PCT Filed: Feb. 22, 2018

(86) PCT No.: PCT/CN2018/076944
§ 371 (c)(1),
(2) Date: Jul. 11, 2018

(87) PCT Pub. No.: WO2019/144452
PCT Pub. Date: Aug. 1, 2019

(30) Foreign Application Priority Data

Jan. 23, 2018 (CN) .......................... 2018 1 0065169

(51) Int. Cl.
*H01L 51/56* (2006.01)
*H01L 27/32* (2006.01)
*H01L 51/52* (2006.01)

(52) U.S. Cl.
CPC .......... *H01L 51/56* (2013.01); *H01L 27/3262* (2013.01); *H01L 27/3276* (2013.01); *H01L 51/5253* (2013.01); *H01L 2251/5338* (2013.01)

(58) Field of Classification Search
None
See application file for complete search history.

(56) References Cited

U.S. PATENT DOCUMENTS 9,837,634 B2    12/2017  Kim et al.
2016/0204183 A1*  7/2016  Tao ..................... H01L 51/0097

FOREIGN PATENT DOCUMENTS

| CN | 104103669 A | 10/2014 |
| CN | 106252380 A | 12/2016 |
| CN | 107491221 A | 12/2017 |

* cited by examiner

*Primary Examiner* — Herve-Louis Y Assouman
(74) *Attorney, Agent, or Firm* — Leong C. Lei

(57) ABSTRACT

A method for manufacturing a flexible display panel and a flexible display device are provided. The method includes bonding a curved section of a flexible display panel to a flexible circuit board, curving the curved section of the flexible display panel toward a back side of the flexible display panel, and forming a first protective resin layer on the flexible display panel to be located on a front side thereof at a location corresponding to the curved section. The first protective resin layer provides protection to wiring on the curved section. Since the first protective layer is formed after the curved section has been curved, compared to the known techniques, the difficulty of curving the curved section of the flexible display panel is reduced; the stress that the curved section of the flexible display panel must take during curving the curved section is reduced; and product quality is enhanced.

15 Claims, 6 Drawing Sheets

METHOD FOR MANUFACTURING FLEXIBLE DISPLAY DEVICE AND FLEXIBLE DISPLAY DEVICE

RELATED APPLICATIONS

The present application is a National Phase of International Application Number PCT/CN2018/076944, filed Feb. 22, 2018, and claims the priority of China Application No. 201810065169.3, filed Jan. 23, 2018.

BACKGROUND OF THE INVENTION

1. Field of the Invention

The present invention relates to the field of display technology, and more particular to a method for manufacturing a flexible display device and a flexible display device.

2. The Related Arts

Organic light-emitting display (OLED) devices possess various advantages, such as being self-luminous, low drive voltage, high luminous efficiency, short response time, high clarity and contrast, almost 180° view angle, wide range of operation temperature, and easy realization of flexible displaying and large-area full-color displaying, and are considered the most promising display devices.

An OLED device is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carriers are injected and re-combine to cause emission of light. Specifically, the OLED display device often uses an indium tin oxide (ITO) electrode and a metal electrode to respectively serve as the anode and cathode of the device and electrons and holes, when driven by a predetermined electrical voltage, are respectively injected, from the cathode and the anode, into the electron transport layer and the hole transport layer such that the electrons and the holes respectively migrate through the electron transport layer and the hole transport layer to get into the emissive layer and meet in the emissive layer to form excitons that excites light emissive molecules, the later undergoing radiation relaxation to give off visible light.

With the development of technology and science, flexible display device demonstrate wider and wider applications and the flexible OLED display devices are now considered the most promising flexible display technology, such that investment in all aspects and market share are continuously increasing. Referring to FIG. 1, a known flexible display device is shown, comprising a flexible display panel 100' and a flexible printed circuit (FPC) 200' bonded to the flexible display panel 100'. The flexible display panel 100' comprises a curved section 110' at one end thereof. The FPC 200' is bonded to the curved section 110' of the flexible display panel 100'. The curved section 100' of the flexible display panel 100' is curved toward a back side of the flexible display panel 100" in order to reduce a width of a border of the display device and increase the screen-to-body ratio. Heretofore, before curving of the curved section 110' of the flexible display panel 100' is carried out, a protective glue layer 500' (such as ultraviolet curable glue) is coated and curved on the flexible display panel 100' at a location corresponding to curved section 110', and then, the curved section 110' of the flexible display panel 100' and the protective glue layer 500' thereon are curved toward the back side of the flexible display panel 100'. The protective glue layer 500' is provided for protecting the curved section 110' of the flexible display panel 100'. However, the protective glue layer 500' has a thickness that is greater than a flexible substrate of the flexible display panel 100' and would exhibit increased hardness after being cured. This would greatly increase the difficulty of curving the curved section 110' of the flexile display panel 100' and would also increase the stress that the curved section 110' must take during curving so as to cause damage to circuitry within the curved section 110'.

SUMMARY OF THE INVENTION

An objective of the present invention is to provide a method for manufacturing a flexible display device, which offers protection to a curved section of a flexible display panel, reduces difficulty of curving the curved section of the flexible display panel, and prevents the curved section of the flexible display panel from being subjected to an increased stress.

Another objective of the present invention is to provide a flexible display device, which offers protection to a curved section of a flexible display panel, reduces difficulty of curving the curved section of the flexible display panel, and prevents the curved section of the flexible display panel from being subjected to an increased stress.

To achieve the above objectives, firstly, the present invention provides a method for manufacturing a flexible display panel, which comprises the following steps:

Step S1: providing a flexible display panel.

wherein the flexible display panel comprises a curved section arranged at an end thereof:

Step S2: providing a flexible circuit board and bonding the flexible circuit board to the curved section of the flexible display panel:

Step S3: curving the curved section of the flexible display panel toward a back side of the flexible display panel; and Step S4: coating a resin material on the flexible display panel to form a first protective resin layer on a front side of the flexible display panel to correspond to the curved section.

The flexible display panel comprises a flexible substrate, a thin-film transistor (TFT) array layer and an organic light-emitting display (OLED) device layer formed in sequence on one side of the flexible substrate, and a wiring layer formed the side of the flexible substrate on which the TFT array layer is formed and located on the curved section, the back side of the flexible display panel being one side of the flexible substrate that is distant from the TFT array layer, the first protective resin layer being formed on the wiring layer.

The flexible substrate is formed of a material comprising one or a combination of multiple ones of polyimide, polyetherimide, polyphenylene sulfide, and polyarylate.

The flexible display panel further comprises a film package layer that covers the OLED device layer; and Step S1 further comprises forming, in sequence on one side of the film package layer that is distant from the flexible backing, a touch control layer, a circular polarization plate, and a protection cover plate.

Step S4 comprises: coating, through spraying, a resin material on the front side of the flexible display panel to correspond to the curved section in order to form the first protective resin layer on the front side of the flexible display panel at a location corresponding to the curved section.

Step S4 comprises: dipping the curved section of the flexible display panel in a resin material to have the resin material coated on the front side and back side of the flexible display panel to correspond to the curved section in order to form a first protective resin layer on the front side of the flexible display panel at a location corresponding to the curved section and to also form a second protective resin layer on the back side of the flexible display panel 100 at a location corresponding to the curved section.

The resin material comprises an ultraviolet light curable resin, a heat-curable resin, or a room temperature curable resin, and Step S4 further comprises a step of curing the resin material after coating the resin material on the flexible display panel.

The flexible display panel is provided with a support board on the back side thereof and the support board covers a portion the flexible display panel excluding the curved section.

Before Step S3, a step is further included to provide a double-sided adhesive tape on one side of the support board that is distant from the flexible display panel or one side of the flexible circuit board that is the same side as the back side of the flexible display panel so that after the curved section of the flexible display panel is curved toward the back side of the flexible display panel in Step S3, the double-sided adhesive tape adhesively fixes the flexible circuit board and the support board together.

The present invention also provides a flexible display device formed with the above-described method for manufacturing a flexible display panel, wherein the flexible display device comprises: a flexible display panel, a flexible circuit board bonded to the flexible display panel, and a first protective resin layer arranged on the flexible display panel:

wherein the flexible display panel comprises a curved section arranged at an end thereof and the flexible circuit board is bonded to the curved section of the flexible display panel; the curved section of the flexible display panel is curved toward a back side of the flexible display panel; and the first protective resin layer is arranged on a front side of the flexible display panel at a location corresponding to the curved section.

The present invention further provides a method for manufacturing a flexible display panel, which comprises the following steps:

Step S1: providing a flexible display panel, wherein the flexible display panel comprises a curved section arranged at an end thereof;

Step S2: providing a flexible circuit board and bonding the flexible circuit board to the curved section of the flexible display panel;

Step S3: curving the curved section of the flexible display panel toward a back side of the flexible display panel; and Step S4: coating a resin material on the flexible display panel to form a first protective resin layer on a front side of the flexible display panel to correspond to the curved section;

wherein the flexible display panel comprises a flexible substrate, a thin-film transistor (TFT) array layer and an organic light-emitting display (OLED) device layer formed in sequence on one side of the flexible substrate, and a wiring layer formed the side of the flexible substrate on which the TFT array layer is formed and located on the curved section, the back side of the flexible display panel being one side of the flexible substrate that is distant from the TFT array layer, the first protective resin layer being formed on the wiring layer;

wherein the flexible substrate is formed of a material comprising one or a combination of multiple ones of polyimide, polyetherimide, polyphenylene sulfide, and polyarylate;

wherein the flexible display panel further comprises a film package layer that covers the OLED device layer; and Step S1 further comprises forming, in sequence on one side of the film package layer that is distant from the flexible backing, a touch control layer, a circular polarization plate, and a protection cover plate; and wherein the flexible display panel is provided with a support board on the back side thereof and the support board covers a portion the flexible display panel excluding the curved section.

The efficacy of the present invention is that the present invention provides a method for manufacturing a flexible display panel, in which a curved section of a flexible display panel is first bonded to a flexible circuit board, and then, the curved section of the flexible display panel is curved toward the back side of the flexible display panel, and afterwards, a first protective resin layer is formed on the flexible display panel to be located on the front side of the flexible display panel at a location corresponding to the curved section. The first protective resin layer provides protection to wiring on the curved section. Since the first protective layer is formed after the curved section has been curved, compared to the known techniques, the difficulty of curving the curved section of the flexible display panel can be reduced; the stress that the curved section of the flexible display panel must take during curving can also be reduced; and product quality can be enhanced. The present invention provides a flexible display device that is manufactured with the above-described method for manufacturing a flexible display panel so that protection is provided to the curve section of the flexible display panel to reduce the difficulty of curving the curved section of the flexible display panel and prevent the curved section of the flexible display panel from subjecting to increased stresses during curving of the curved section.

BRIEF DESCRIPTION OF THE DRAWINGS

For better understanding of the features and technical contents of the present invention, reference will be made to the following detailed description of the present invention, in combination with the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
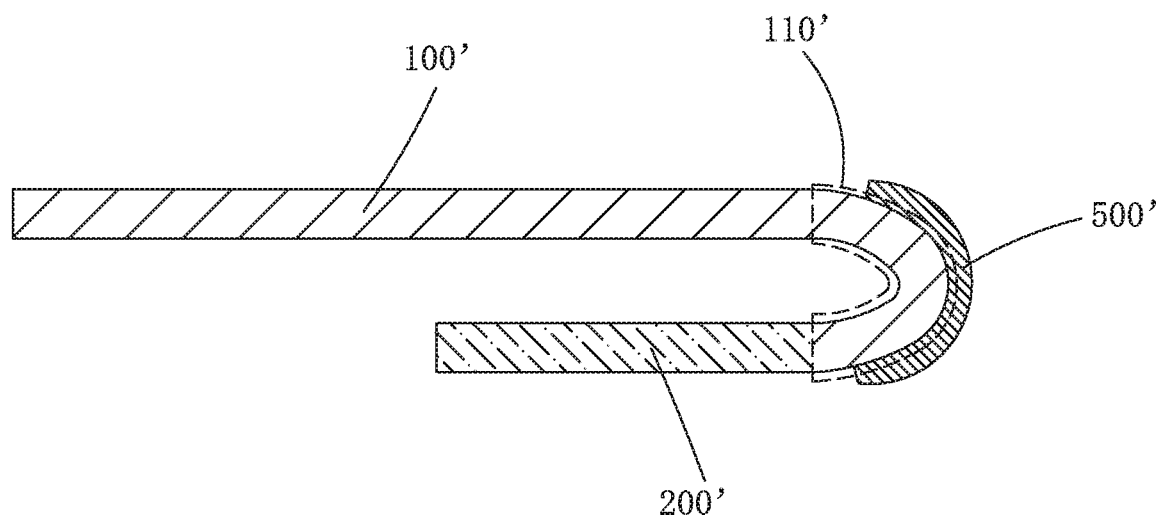
FIG. 1 is a schematic view showing a structure of a known flexible display device.
Figure 2:
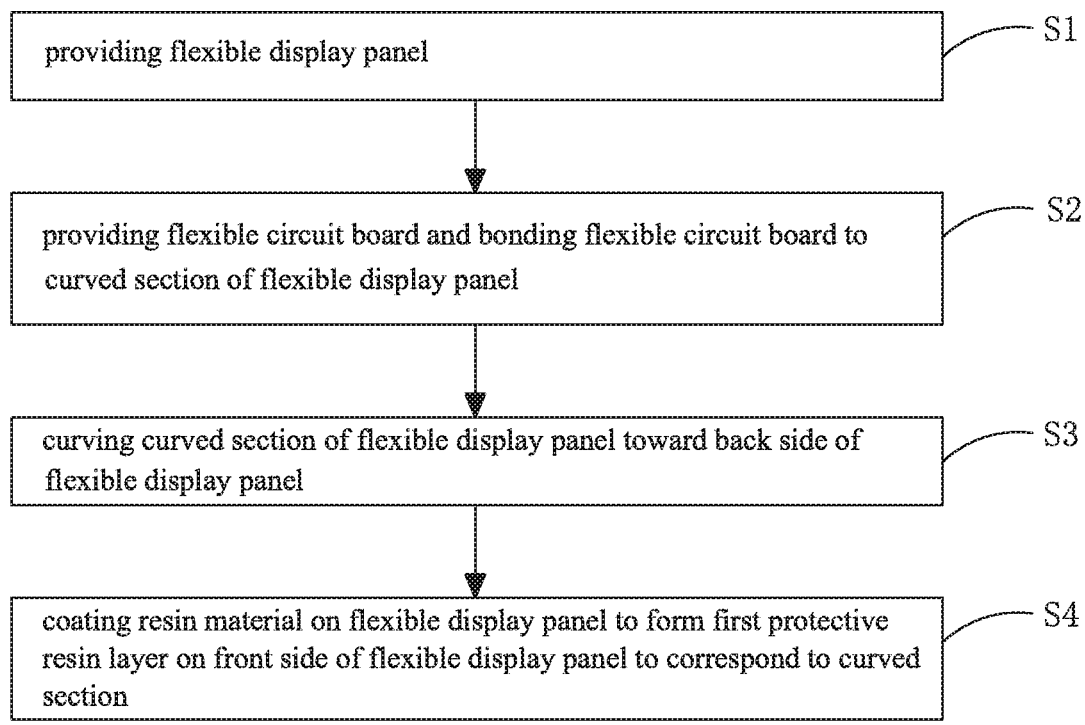
FIG. 2 is a flow chart illustrating a method for manufacturing a flexible display device according to the present invention.
Figure 3:
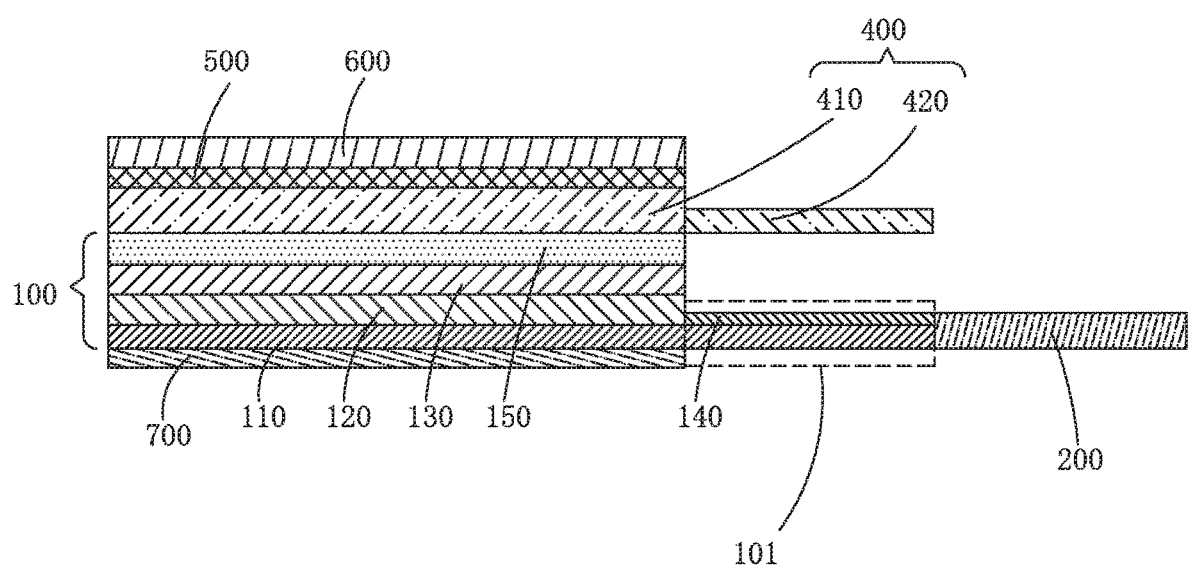
FIG. 3 is a schematic view illustrating steps S1 and S2 of the method for manufacturing a flexible display device according to the present invention.

Referring to FIG. 2, the present invention provides a method for manufacturing a flexible display panel, which comprises the following steps:

Step S1: referring to FIG. 3, providing a flexible display panel 100, wherein the flexible display panel 100 comprises a curved section 101 arranged at an end thereof.

Specifically, referring to FIG. 3, the flexible display panel 100 comprises a flexible substrate 110, a thin-film transistor (TFT) array layer 120 and an organic light-emitting display (OLED) device layer 130 formed in sequence on one side of the flexible substrate 110, and a wiring layer 140 formed the side of the flexible substrate 110 on which the TFT array layer 120 is formed and located on the curved section 101. The flexible display panel 100 has a back side that is one side of the flexible substrate 110 that is distant from the TFT array layer 120; and the flexible display panel 100 has a front side that is one side that is opposite to the back side.

Specifically, the wiring layer 140 may be set on the same layer as a source/drain layer of the TFT array layer 120. Insulation layers (not shown) are formed between the wiring layer 140 and the flexible substrate 110 and on the wiring layer 140, respectively.

Specifically, the flexible substrate 110 is formed of a material that includes, but not limited to, one or a combination of multiple ones of polyimide (PI), polyetherimide (PEI), polyphenylene sulfide (PPS), and polyarylate (PAR).

Specifically, the TFT array layer 120 comprises multiple TFTs. The multiple TFTs can be indium gallium zinc oxide (IGZO) semiconductor TFTs, or low-temperature poly-silicon TFTs, and may alternatively be other TFTs that are used in the art.

Specifically, referring to FIG. 3, the flexible display panel 100 further comprises a film package layer 150 that covers the OLED device layer 130 to prevent invasion of moisture and oxygen into the OLED device layer 130.

Specifically, Step S1 further comprises forming, in sequence on one side of the film package layer 150 that is distant from the flexible backing 110, a touch control layer 400, a circular polarization plate 500, and a protection cover plate 600.

Specifically, referring to FIG. 3, the touch control layer 400 comprises a touch control layer 410 formed on the film package layer 150 and a flexible touch-control circuit board 420 connected to the touch control layer 410.

Specifically, the touch control layer 400 is provided to achieve a touch control function of the flexible display device; the circular polarization plate 500 is provided for reducing reflection of external incident light; and the protection cover plate 600 is provided to protect the entirety of the flexible display device.

Specifically, adhesive materials of various types, including optically clear adhesive (OCA), are used between the touch control layer 400 and the flexible display panel 100, between the touch control layer 400 and the circular polarization plate 500, and between the circular polarization plate 500 and the protection cover plate 600 for adhesively bonding therebetween.

Specifically, the flexible display panel 100 is provided, on the back side thereof, with a support board 700. The support board 700 is arranged to cover a portion of the flexible display panel 100 that excludes the curved section 101 in order to provide support and protection to the flexible substrate 110.

Step S2: referring to FIG. 3, providing a flexible circuit board 200 and bonding the flexible circuit board 200 to the curved section 101 of the flexible display panel 100.

Figure 4:
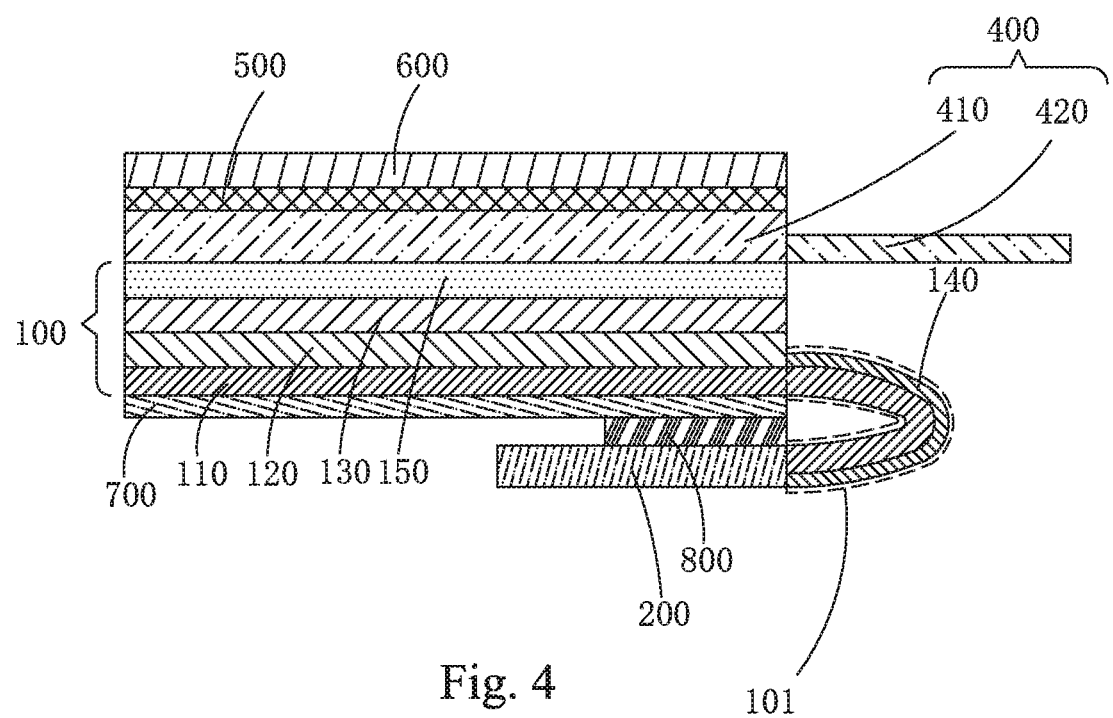
FIG. 4 is a schematic view illustrating step S3 of the method for manufacturing a flexible display device according to the present invention.

Step S3: referring to FIG. 4, curving the curved section 101 of the flexible display panel 100 toward the back side of the flexible display panel 100.

Specifically, before Step S3, a step is further included to provide a double-sided adhesive tape 800 on one side of the support board 700 that is distant from the flexible display panel 100 or one side of the flexible circuit board 200 that is the same side as the back side of the flexible display panel 100. After the curved section 101 of the flexible display panel 100 is curved toward the back side of the flexible display panel 100 in Step S3, the double-sided adhesive tape 800 adhesively fixes the flexible circuit board 200 and the support board 700 together. Curving the curved section 101 of the flexible display panel 100 toward the back side of the flexible display panel 100 could effectively reduce a border width of the display device and increase the screen-to-body ratio.

Step S4: coating a resin material on the flexible display panel 100 to form a first protective resin layer 310 on the front side of the flexible display panel 100 to correspond to the curved section 101.

Specifically, the first protective resin layer 310 is arranged on the wiring layer 140. Further, the first protective resin layer 310 is arranged on the insulation layer that is formed on the wiring layer 140.

Figure 5:
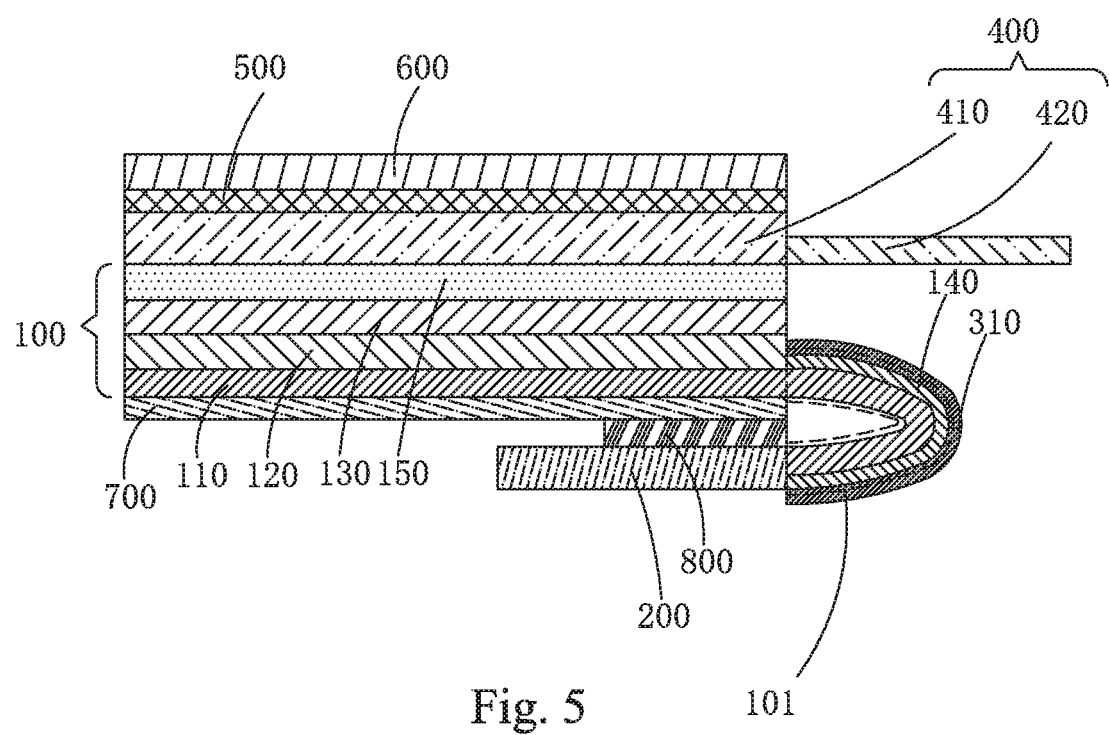
FIG. 5 is a schematic view illustrating step S4 of the method for manufacturing a flexible display device according to a first embodiment of the present invention and is also a schematic view illustrating a structure of a flexible display device according to the first embodiment of the present invention.

Specifically, referring to FIG. 5, in a first embodiment of the method for manufacturing a flexible display panel according to the present invention, Step S4 specifically comprises: coating, through spraying, a resin material on the front side of the flexible display panel 100 to correspond to the curved section 101 in order to form a first protective resin layer 310 on the front side of the flexible display panel 100 at a location corresponding to the curved section 101 so that the first protective resin layer 310 is used to provide support and protection to the curved section 101 of the flexible display panel 100.

Figure 6:
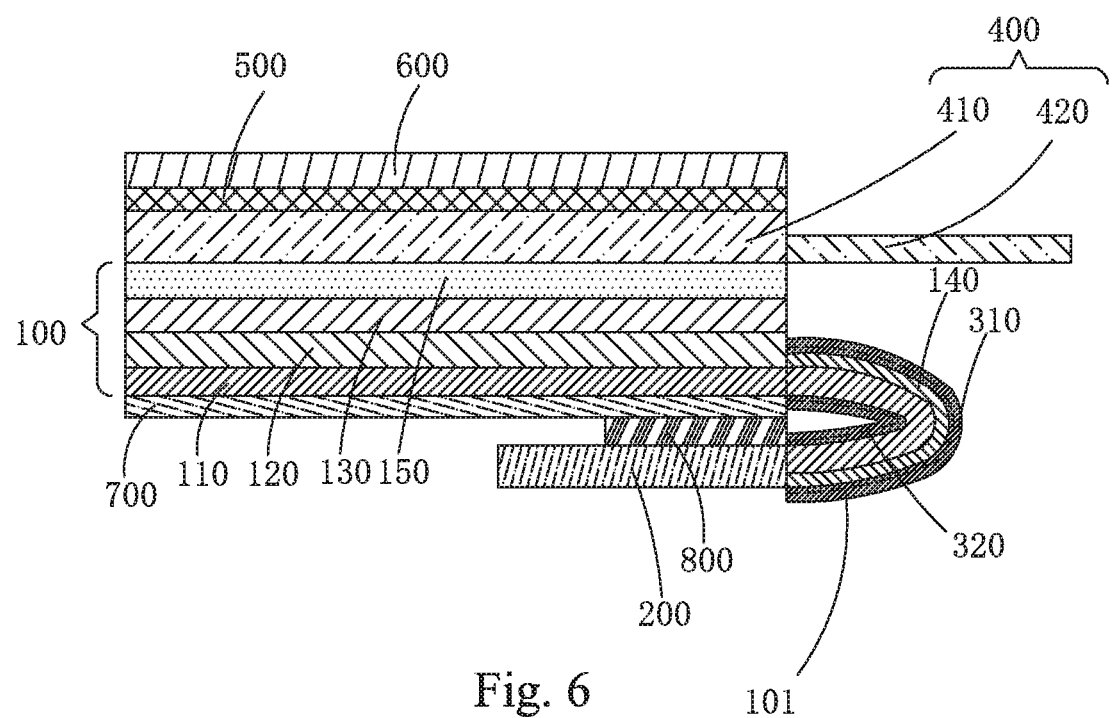
FIG. 6 is a schematic view illustrating step S4 of the method for manufacturing a flexible display device according to a second embodiment of the present invention and is also a schematic view illustrating a structure of a flexible display device according to the second embodiment of the present invention.

Specifically, referring to FIG. 6, in a second embodiment of the method for manufacturing a flexible display panel according to the present invention, Step S4 specifically comprises: dipping the curved section 101 of the flexible display panel 100 in a resin material to have the resin material coated on the front side and back side of the flexible display panel 100 to correspond to the curved section 101 in order to form a first protective resin layer 310 on the front side of the flexible display panel 100 at a location corresponding to the curved section 101 and to also form a second protective resin layer 320 on the back side of the flexible display panel 100 at a location corresponding to the curved section 101 so that the first protective resin layer 310 and the second protective resin layer 320 provide, simultaneously, support and protection to a front side and a side of the curved section 101 of the flexible display panel 100, offering a better effect of support and protection.

Specifically, the resin material can be, but not limited to, ultraviolet (UV) light curable resins, heat-curable resins, or room temperature curable resins. Step S4 further comprises a step of curing the resin material after coating the resin material on the flexible display panel 100 in order to form a solidified and robust first protective resin layer 310 or solidified and robust first protective resin layer 310 and second protective resin layer 320.

It is noted that in the method for manufacturing a flexible display panel according to the present invention, the curved section 101 of the flexible display panel 100 is first bonded to the flexible circuit board 200, and then, the curved section 101 of the flexible display panel 100 is curved toward the back side of the flexible display panel 100, and afterwards, the first protective resin layer 310 is formed on the flexible display panel 100 to be located on the front side of the flexible display panel 100 at a location corresponding to the curved section 101, and additionally, the second protective resin layer 320 may be formed on the back side of the flexible display panel 100 at a location corresponding to the curved section 101 so that the first protective resin layer 310 and the second protective resin layer 320 provide protection and support to the curved section 101 to prevent the wiring layer on the curved section 101 from breaking caused by curving. Since the first protective layer 310 and the second protective layer 320 are formed after the curved section 101 has been curved, compared to the known techniques, the difficulty of curving the curved section 101 of the flexible display panel 100 can be reduced; the stress that the curved section 101 of the flexible display panel 100 must take during curving can also be reduced; and product quality can be enhanced.

Based on the same inventive idea, the present invention also provides a flexible display device that is manufactured with the above-described method for manufacturing a flexible display panel. Referring to FIG. 5, which shows a first embodiment of the flexible display device according to the present invention, the flexible display device comprises: a flexible display panel 100, a flexible circuit board 200 bonded to the flexible display panel 100, and a first protective resin layer 310 arranged on the flexible display panel 100.

The flexible display panel 100 comprises a curved section 101 arranged at an end thereof. The flexible circuit board 200 is bonded to the curved section 101 of the flexible display panel 100. The curved section 101 of the flexible display panel 100 is curved toward a back side of the flexible display panel 100. The first protective resin layer 310 is arranged on a front side of the flexible display panel 100 at a location corresponding to the curved section 101.

Specifically, referring to FIG. 5, the flexible display panel 100 comprises a flexible substrate 110, a thin-film transistor (TFT) array layer 120 and an organic light-emitting display (OLED) device layer 130 formed in sequence on one side of the flexible substrate 110, and a wiring layer 140 formed the side of the flexible substrate 110 on which the TFT array layer 120 is formed and located on the curved section 101. The flexible display panel 100 has a back side that is one side of the flexible substrate 110 that is distant from the TFT array layer 120; and the flexible display panel 100 has a front side that is one side that is opposite to the back side.

Specifically, the wiring layer 140 may be set on the same layer as a source/drain layer of the TFT array layer 120. Insulation layers (not shown) are formed between the wiring layer 140 and the flexible substrate 110 and on the wiring layer 140, respectively.

Specifically, the first protective resin layer 310 is arranged on the wiring layer 140. Further, the first protective resin layer 310 is arranged on the insulation layer that is formed on the wiring layer 140.

Specifically, the flexible substrate 110 is formed of a material that includes, but not limited to, one or a combination of multiple ones of polyimide (PI), polyetherimide (PEI), polyphenylene sulfide (PPS), and polyarylate (PAR).

Specifically, the TFT array layer 120 comprises multiple TFTs. The multiple TFTs can be indium gallium zinc oxide (IGZO) semiconductor TFTs, or low-temperature poly-silicon TFTs. and may alternatively be other TFTs that are used in the art.

Specifically, referring to FIG. 5, the flexible display panel 100 further comprises a film package layer 150 that covers the OLED device layer 130 to prevent invasion of moisture and oxygen into the OLED device layer 130.

Specifically, referring to FIG. 5, the flexible display device further comprises a touch control layer 400, a circular polarization plate 500, and a protection cover plate 600 that are formed, in sequence on one side of the film package layer 150 that is distant from the flexible backing 110.

Specifically, referring to FIG. 5, the touch control layer 400 comprises a touch control layer 410 formed on the film package layer 150 and a flexible touch-control circuit board 420 connected to the touch control layer 410.

Specifically, the touch control layer 400 is provided to achieve a touch control function of the flexible display device; the circular polarization plate 500 is provided for reducing reflection of external incident light; and the protection cover plate 600 is provided to protect the entirety of the flexible display device.

Specifically, adhesive materials of various types, including optically clear adhesive (OCA), are used between the touch control layer 400 and the flexible display panel 100, between the touch control layer 400 and the circular polarization plate 500, and between the circular polarization plate 500 and the protection cover plate 600 for adhesively bonding therebetween.

Specifically, the flexible display panel 100 is provided, on the back side thereof, with a support board 700. The support board 700 is arranged to cover a portion of the flexible display panel 100 that excludes the curved section 101 in order to provide support and protection to the flexible substrate 110.

Specifically, the flexible display panel 100 further comprises a double-sided adhesive tape 800 that adhesively fixes the flexible circuit board 200 and the support board 700 together to fix the flexible circuit board 200 in position.

Specifically, in the present invention, the first protective resin layer 310 is formed after the curved section 101 of the flexible display panel 100 has been curved. In a first embodiment of the flexible display device according to the present invention, a process for manufacturing the first protective resin layer 310 specifically comprises: coating, through spraying, a resin material on the front side of the flexible display panel 100 to correspond to the curved section 101 in order to form the first protective resin layer 310 on the front side of the flexible display panel 100 at a location corresponding to the curved section 101.

Specifically, the resin material can be, but not limited to, ultraviolet (UV) light curable resins, heat-curable resins, or room temperature curable resins.

It is noted that the flexible display device of the present invention is structured such that the first protective resin layer 310 is formed after the curved section 101 of the flexible display panel 100 has been curved. The first protective resin layer 310 provide protection and support to the curved section 101 to prevent the wiring layer 140 on the curved section 101 from breaking due to curving. Since the first protective layer 310 is formed after the curved section 101 has been curved, compared to the known techniques, the difficulty of curving the curved section 101 of the flexible display panel 100 can be reduced; the stress that the curved section 101 of the flexible display panel 100 must take during curving can also be reduced; and product quality can be enhanced.

Referring to FIG. 6, a second embodiment of the flexible display device according to the present invention is shown. The second embodiment is different from the first embodiment in that the flexible display device further comprises a second protective resin layer 320 formed on the back side of the flexible display panel 100 at a location corresponding to the curved section 101. The second protective resin layer 320 and the first protective resin layer 310 are formed at the same time, of which a manufacturing process specifically comprises: dipping the curved section 101 of the flexible display panel 100 in a resin material to have the resin material coated on the front side and back side of the flexible display panel 100 to correspond to the curved section 101 in order to form the first protective resin layer 310 on the front side of the flexible display panel 100 at a location corresponding to the curved section 101 and to also form the second protective resin layer 320 on the back side of the flexible display panel 100 at a location corresponding to the curved section 101.

It is noted that in the second embodiment of the flexible display device according to the present invention, the first protective resin layer 310 and the second protective resin layer 320 are used to simultaneously provide support and protection to the front side and the back side of the curved section 101 of the flexible display panel 100, so that the effect of support and protection is better and product quality could be further enhanced.

In summary, the present invention provides a method for manufacturing a flexible display panel, in which a curved section of a flexible display panel is first bonded to a flexible circuit board, and then, the curved section of the flexible display panel is curved toward the back side of the flexible display panel, and afterwards, a first protective resin layer is formed on the flexible display panel to be located on the front side of the flexible display panel at a location corresponding to the curved section. The first protective resin layer provides protection to wiring on the curved section. Since the first protective layer is formed after the curved section has been curved, compared to the known techniques, the difficult), of curving the curved section of the flexible display panel can be reduced; the stress that the curved section of the flexible display panel must take during curving can also be reduced; and product quality can be enhanced. The present invention provides a flexible display device that is manufactured with the above-described method for manufacturing a flexible display panel so that protection is provided to the curve section of the flexible display panel to reduce the difficulty of curving the curved section of the flexible display panel and prevent the curved section of the flexible display panel from subjecting to increased stresses during curving of the curved section.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A method for manufacturing a flexible display panel, comprising the following steps:
   Step S1: providing a flexible display panel,
      wherein the flexible display panel comprises a curved section arranged at an end thereof;
   Step S2: providing a flexible circuit board and bonding the flexible circuit board to the curved section of the flexible display panel;
   Step S3: curving the curved section of the flexible display panel toward a back side of the flexible display panel; and
   Step S4: coating a resin material on the flexible display panel to form a first protective resin layer on a front side of the flexible display panel to correspond to the curved section.

2. The method for manufacturing a flexible display panel according to claim 1, wherein the flexible display panel comprises a flexible substrate, a thin-film transistor (TFT) array layer and an organic light-emitting display (OLED) device layer formed in sequence on one side of the flexible substrate, and a wiring layer formed the side of the flexible substrate on which the TFT array layer is formed and located on the curved section, the back side of the flexible display panel being one side of the flexible substrate that is distant from the TFT array layer, the first protective resin layer being formed on the wiring layer.

3. The method for manufacturing a flexible display panel according to claim 2, wherein the flexible substrate is formed of a material comprising one or a combination of multiple ones of polyimide, polyetherimide, polyphenylene sulfide, and polyarylate.

4. The method for manufacturing a flexible display panel according to claim 2, wherein the flexible display panel further comprises a film package layer that covers the OLED device layer; and
   Step S1 further comprises forming, in sequence on one side of the film package layer that is distant from the flexible backing, a touch control layer, a circular polarization plate, and a protection cover plate.

5. The method for manufacturing a flexible display panel according to claim 1, wherein Step S4 comprises: coating, through spraying, a resin material on the front side of the flexible display panel to correspond to the curved section in order to form the first protective resin layer on the front side of the flexible display panel at a location corresponding to the curved section.

6. The method for manufacturing a flexible display panel according to claim 1, wherein Step S4 comprises: dipping the curved section of the flexible display panel in a resin material to have the resin material coated on the front side and back side of the flexible display panel to correspond to the curved section in order to form a first protective resin layer on the front side of the flexible display panel at a location corresponding to the curved section and to also form a second protective resin layer on the back side of the flexible display panel 100 at a location corresponding to the curved section.

7. The method for manufacturing a flexible display panel according to claim 1, wherein the resin material comprises an ultraviolet light curable resin, a heat-curable resin, or a room temperature curable resin, and Step S4 further comprises a step of curing the resin material after coating the resin material on the flexible display panel.

8. The method for manufacturing a flexible display panel according to claim 1, wherein the flexible display panel is provided with a support board on the back side thereof and the support board covers a portion the flexible display panel excluding the curved section.

9. The method for manufacturing a flexible display panel according to claim 8 further comprising, before Step S3, provide a double-sided adhesive tape on one side of the support board that is distant from the flexible display panel or one side of the flexible circuit board that is the same side as the back side of the flexible display panel so that after the curved section of the flexible display panel is curved toward the back side of the flexible display panel in Step S3, the double-sided adhesive tape adhesively fixes the flexible circuit board and the support board together.

10. A flexible display device formed with the method for manufacturing a flexible display panel according to claim 1, the flexible display device comprising: a flexible display panel, a flexible circuit board bonded to the flexible display panel, and a first protective resin layer arranged on the flexible display panel;
wherein the flexible display panel comprises a curved section arranged at an end thereof and the flexible circuit board is bonded to the curved section of the flexible display panel; the curved section of the flexible display panel is curved toward a back side of the flexible display panel; and the first protective resin layer is arranged on a front side of the flexible display panel at a location corresponding to the curved section.

11. A method for manufacturing a flexible display panel, comprising the following steps:
Step S1: providing a flexible display panel,
wherein the flexible display panel comprises a curved section arranged at an end thereof;
Step S2: providing a flexible circuit board and bonding the flexible circuit board to the curved section of the flexible display panel;
Step S3: curving the curved section of the flexible display panel toward a back side of the flexible display panel; and
Step S4: coating a resin material on the flexible display panel to form a first protective resin layer on a front side of the flexible display panel to correspond to the curved section;
wherein the flexible display panel comprises a flexible substrate, a thin-film transistor (TFT) array layer and an organic light-emitting display (OLED) device layer formed in sequence on one side of the flexible substrate, and a wiring layer formed the side of the flexible substrate on which the TFT array layer is formed and located on the curved section, the back side of the flexible display panel being one side of the flexible substrate that is distant from the TFT array layer, the first protective resin layer being formed on the wiring layer;
wherein the flexible substrate is formed of a material comprising one or a combination of multiple ones of polyimide, polyetherimide, polyphenylene sulfide, and polyarylate;
wherein the flexible display panel further comprises a film package layer that covers the OLED device layer; and
Step S1 further comprises forming, in sequence on one side of the film package layer that is distant from the flexible backing, a touch control layer, a circular polarization plate, and a protection cover plate; and
wherein the flexible display panel is provided with a support board on the back side thereof and the support board covers a portion the flexible display panel excluding the curved section.

12. The method for manufacturing a flexible display panel according to claim 11, wherein Step S4 comprises: coating, through spraying, a resin material on the front side of the flexible display panel to correspond to the curved section in order to form the first protective resin layer on the front side of the flexible display panel at a location corresponding to the curved section.

13. The method for manufacturing a flexible display panel according to claim 11, wherein Step S4 comprises: dipping the curved section of the flexible display panel in a resin material to have the resin material coated on the front side and back side of the flexible display panel to correspond to the curved section in order to form a first protective resin layer on the front side of the flexible display panel at a location corresponding to the curved section and to also form a second protective resin layer on the back side of the flexible display panel 100 at a location corresponding to the curved section.

14. The method for manufacturing a flexible display panel according to claim 11, wherein the resin material comprises an ultraviolet light curable resin, a heat-curable resin, or a room temperature curable resin, and Step S4 further comprises a step of curing the resin material after coating the resin material on the flexible display panel.

15. The method for manufacturing a flexible display panel according to claim 11 further comprising, before Step S3, provide a double-sided adhesive tape on one side of the support board that is distant from the flexible display panel or one side of the flexible circuit board that is the same side as the back side of the flexible display panel so that after the curved section of the flexible display panel is curved toward the back side of the flexible display panel in Step S3, the double-sided adhesive tape adhesively fixes the flexible circuit board and the support board together.

\* \* \* \* \*